United States Patent [19]

Kimura et al.

[11] Patent Number: 5,051,771
[45] Date of Patent: Sep. 24, 1991

[54] IMAGE FORMING APPARATUS HAVING CONTROL UNIT FOR CONTROLLING REWINDING OPERATION OF RECORDING MEDIUM

[75] Inventors: Hiroaki Kimura, Nagoya; Naoyuki Hatta, Gamagori, both of Japan

[73] Assignee: Brother Kogyo Kabushiki Kaisha, Japan

[21] Appl. No.: 601,359

[22] Filed: Oct. 23, 1990

[30] Foreign Application Priority Data

Oct. 31, 1989 [JP] Japan .................................. 1-283488

[51] Int. Cl.[5] ...................... G03B 27/32; G03B 27/52
[52] U.S. Cl. ......................................... 355/27; 355/50
[58] Field of Search ................... 355/27, 50, 51, 100; 430/138; 354/297–302; 101/228

[56] References Cited

U.S. PATENT DOCUMENTS

| | | | |
|---|---|---|---|
| 3,756,149 | 9/1973 | Bishop | 101/228 |
| 4,935,768 | 6/1990 | Ibuchi | 355/27 |
| 4,935,769 | 6/1990 | Ogura | 355/27 |
| 4,945,382 | 7/1990 | Yui et al. | 355/27 |
| 4,952,968 | 8/1990 | Ibuchi | 355/27 |

*Primary Examiner*—Richard A. Wintercorn
*Attorney, Agent, or Firm*—Oliff & Berridge

[57] ABSTRACT

An image forming apparatus for forming a visible image using an elongated photosensitive recording medium, comprising an exposing unit for exposing the photosensitive recording medium to light in an exposure process to form a latent image thereon, a pressure-developing unit for developing the latent image into a visible image in a developing process, a sheet feeding unit for feeding the photosensitive recording medium through the exposing unit over the pressure-developing unit along a sheet feed path, a sheet rewinding unit for rewinding the photosensitive recording medium after the developing process to feed the photosensitive recording medium to a predetermined position in the sheet feed path, thereby performing a sheet rewinding operation, and a sheet feed control unit for selecting one of at least two modes of first and second modes such as speedy and saving modes and controlling the sheet rewinding unit to carry out the sheet rewinding operation only when the second mode is selected.

5 Claims, 4 Drawing Sheets

IMAGE FORMING APPARATUS HAVING CONTROL UNIT FOR CONTROLLING REWINDING OPERATION OF RECORDING MEDIUM

BACKGROUND OF THE INVENTION

This invention relates to an image forming apparatus using a web-like (longitudinal or roll type) photosensitive recording medium, and more particularly to an image forming apparatus having a control unit for selectively performing a rewinding operation after a developing process of the medium.

There has been well known a conventional image forming apparatus such as a copying machine in which a photosensitive and pressure-sensitive recording sheet coated with microcapsules encapsulating dye precursor therein is exposed to light to form a latent image thereon, and then superposed over a developer sheet coated with developer material color-reactable with the dye precursor under pressure to pressure-develop the latent image on the photosensitive and pressure-sensitive recording medium into a visible image on the developer sheet.

FIG. 1 shows this type of image forming apparatus. As shown in FIG. 1, the apparatus includes a body frame 1 having an upper portion provided with an original support glass plate 2 for mounting thereon an original, and a cover 3 for opening and closing the original support glass plate 2. The glass plate 2 and the cover 3 are movable in a horizontal direction. A light source 5 including a halogen lamp 4 and reflectors 5 is provided below the original support glass plate 2. The halogen lamp 4 is adapted for irradiating white light to the original on the glass plate 2 and extends in a direction perpendicular to the moving direction of the original support glass plate 2. The reflectors 6 are adapted to direct light emitted from the halogen lamp 5 through the original support glass plate 2 to the original to thereby effectively use the white light. At a right side of the halogen lamp 4 are provided a cooling unit 20 comprising a fan and a louver for cooling the halogen lamp 4. During light irradiation from the halogen lamp 4, the original support glass plate 2 is moved in horizontal direction, so that an entire area of the original is scanned with the light.

An exposure stand 7 is disposed at an internal central portion of the body frame 1. Further, a color filter unit 8 for adjusting a color tone and a focusing lens unit 9 are disposed between the light source 6 and the exposure stand 7. These color filter 8 and the lens unit 9 are supported by an attachment plate 10. A pair of reflection mirrors 11a and 11b are disposed between the lens unit 9 and the exposure stand 7 for adjusting a light path length and focal length. These reflection mirrors 11a and 11b are movably supported on an attachment member 12. The light from the light source 6 is reflected from the original and is directed toward the exposure stand 7 through the color filter 8, the lens unit 9 and the reflection mirrors 11a and 11b. The above exposing elements constituting an exposure system and are shielded from other elements by a light-shielding plate 35.

A sheet cartridge 28 is detachably provided at an upper internal space of the body frame 1. An elongated web-like photosensitive sheet 13 is accommodated in the sheet cartridge 28 such that it is wound around a shaft 14 in a rolled state. As the photosensitive sheet is used a microcapsule sheet coated with a plurality of microcapsules which encapsulate therein chromogenic material or dye precursor. Beside the sheet cartridge 28, there is provided a takeup shaft 15 which is rotatable for winding the microcapsule sheet 13 thereover. Plural sheet feed rollers 16 are rotatably provided to feed and guide the microcapsule sheet 13 through a sheet feed guide 33 and the exposure stand 7 to the takeup shaft 15. The microcapsule sheet 13 drawn out of the sheet cartridge 28 is wound over the takeup shaft 15. During the travel of the sheet 13, it passes along a lower surface of the exposure stand 7 at which the sheet 13 is exposed to an image light reflected from the original for forming a latent image corresponding to an image of the original.

A sheet cassette 18 is detachably provided at a lower inner portion of the body frame 1 and below the exposure stand 7. The sheet cassette 18 is adapted for storing a stack of cut developer sheets 17 each being coated with developer material thereon and having a predetermined size.

A pressure developing unit 19 is disposed at a position between the exposure stand 7 and the takeup shaft 15. In the pressure developing unit 19, the light-exposed microcapsule sheet 13 is superposed with each developer sheet 17 under pressure, so that the non-light exposed microcapsules on the microcapsule sheet 13 are ruptured to induce a chromogenic reaction between the dye precursor issued from the ruptured microcapsules and the developer material coated on the developer sheet 17. As a result, a color output image is formed on the developer sheet 17.

A sector roller 21a (or a suction type of sheet pickup unit) is further provided above the cassette 18 for picking up and feeding the developer sheets 18 one by one. Further, a plurality of feed rollers 21 and a sheet guide 25 are provided between the sheet cassette 18 and the pressure developing unit 19 for transferring the developer sheet 17 from the cassette 18 to the developing unit 19.

At an exit side of the pressure developing unit 19, a separation roller 22 is provided for separating the developer sheet 17 from the microcapsule sheet 13. Further, a heat-fixing unit 23 is disposed downstream of the pressure developing unit 19 for heat-fixing an output image provided on the developer sheet 17. Furthermore, a discharge tray 24 is provided at an extreme end portion of a developer sheet path for receiving the developer sheet 17 which has been subjected to a heat-fixing treatment in the heat-fixing unit 23.

In the image forming apparatus thus constructed, an image forming developing process is substantially completed after a trailing end of a light-exposed area (image area) of the microcapsule sheet 13 is subjected to a pressure developing process in the pressure-developing unit 19 and fed over the separation roller 22 while the microcapsule sheet 13 is superposed with the developer sheet 17. Therefore, the microcapsule sheet 13 can not be subjected to a subsequent exposure process until it is fed over the separation roller 22. In other words, an area between the trailing end 7a of an image area formed in an exposure process and the leading end of another image area formed of the subsequent exposure process is not exposed to the light, that is, is not used to an image forming process. This is vain use of the microcapsule sheet.

In order to effectively use the microcapsule sheet 13, after the trailing end of an image area of a previous exposure process is fed over the separation roller 22, the microcapsule sheet 13 is rewound by rotating the shaft 14 in a reverse direction (counterclockwise in FIG. 1) until the trailing end portion of the image area of the previous exposure process is fed to the exposure stand 7 (for example, the trailing end portion is rewound between a rewinding path as indicated by arrows A and B as shown in FIG. 1). This rewinding operation enables an effective use of the microcapsule sheet and a remarkable reduction in running cost.

As described above, the rewinding operation of the microcapsule sheet requires the microcapsule sheet to be rewound after an image forming process, however, a rewinding speed of the rewinding operation can not be increased because the microcapsule sheet is supplied with a large tension to prevent the slack thereof and high accurate adjustment is required for the rewinding operation. Accordingly, it takes a long time to perform an image forming process in the conventional image forming apparatus.

SUMMARY OF THE INVENTION

An object of this invention is to provide an image forming apparatus capable of performing an image forming process at a high speed and in low cost.

In order to attain the above object, an image forming apparatus for forming a visible image using an elongated photosensitive recording medium, comprises exposing means for exposing the photosensitive recording medium to light in an exposure process to form a latent image thereon, developing means for developing the latent image into a visible image in a developing process, sheet feeding means for feeding the photosensitive recording medium through the exposing means over the developing means along a sheet feed path, sheet rewinding means for rewinding the photosensitive recording medium after the developing process to feed the photosensitive recording medium to a predetermined position in the sheet feed path, thereby performing a sheet rewinding operation, and sheet-feed control means for selecting one of at least two modes of first and second modes and controlling the sheet rewinding means to carry out the sheet rewinding operation only when the second mode is selected.

In the image forming apparatus as described above, when a high speed image forming operation is required, the first mode is selected to carry out an image forming process without carrying out the rewinding operation of the photosensitive recording medium. Further, when the high speed image forming operation is not required, the second mode is selected to carry out the rewinding operation, so that the photosensitive recording medium is rewound to a predetermined position after the developing process is completed.

DETAILED DESCRIPTION OF THE INVENTION

A preferred embodiment of this invention will be described hereunder with reference to the accompanying drawings.

Figure 1:
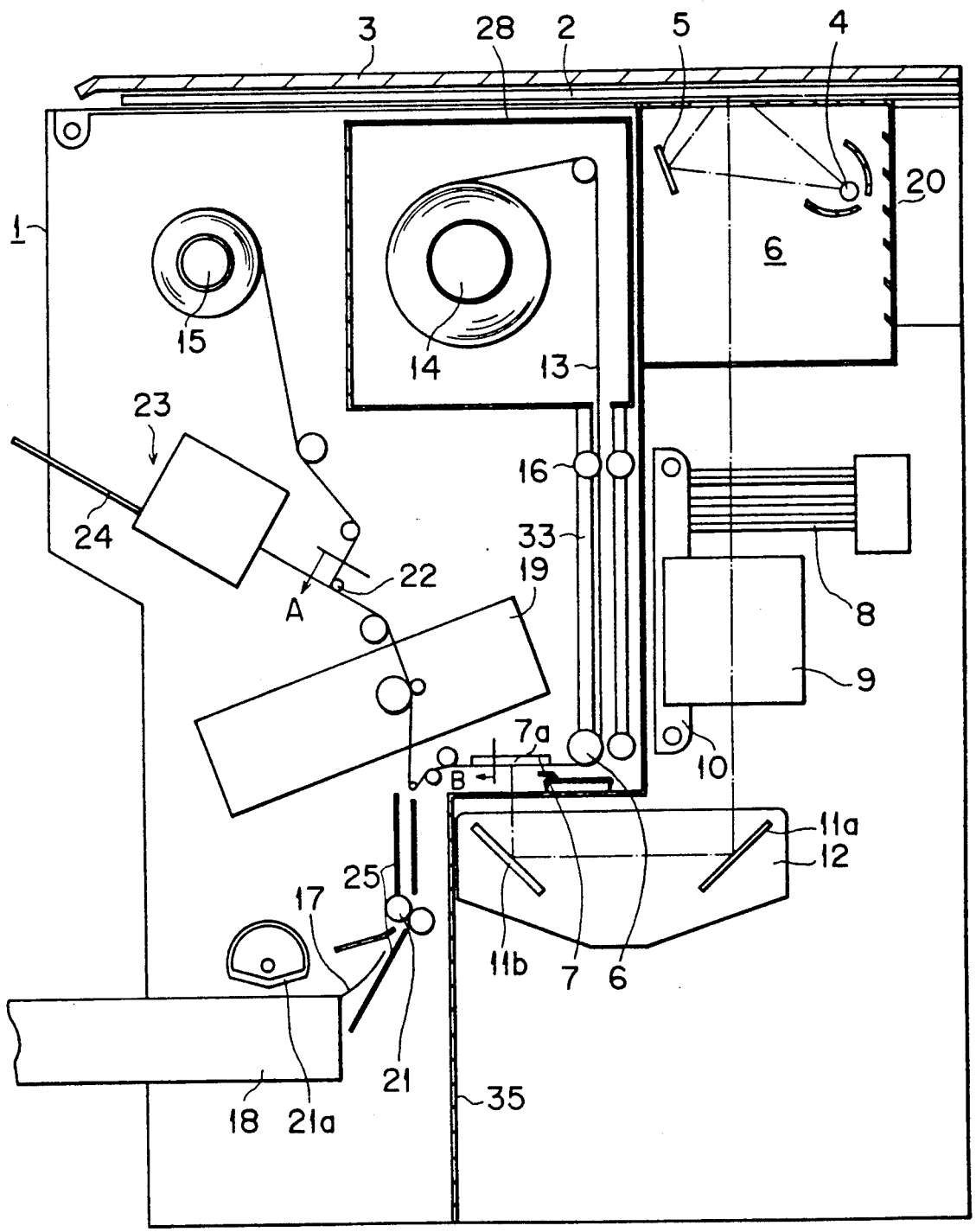
FIG. 1 shows a conventional image forming apparatus.

An image forming apparatus according to this invention has the substantially same construction of the image forming apparatus as shown in FIG. 1, and therefore the description thereof is eliminated.

Figure 2:
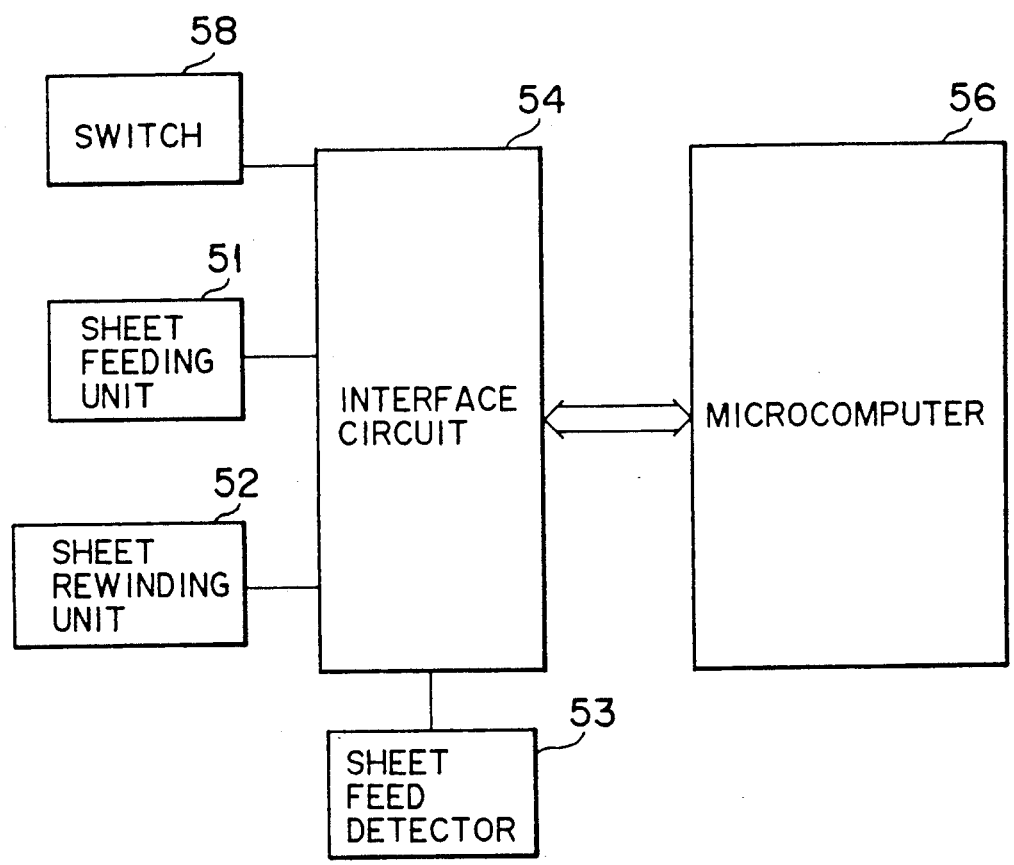
FIG. 2 is a block diagram showing a sheet-feed control system of according to this invention.

FIG. 2 shows a sheet-feed control system for controlling sheet feeding and rewinding operations of the microcapsule sheet in which at least two modes such as a speedy mode and a saving mode of the microcapsule sheet are adopted.

Figure 3:
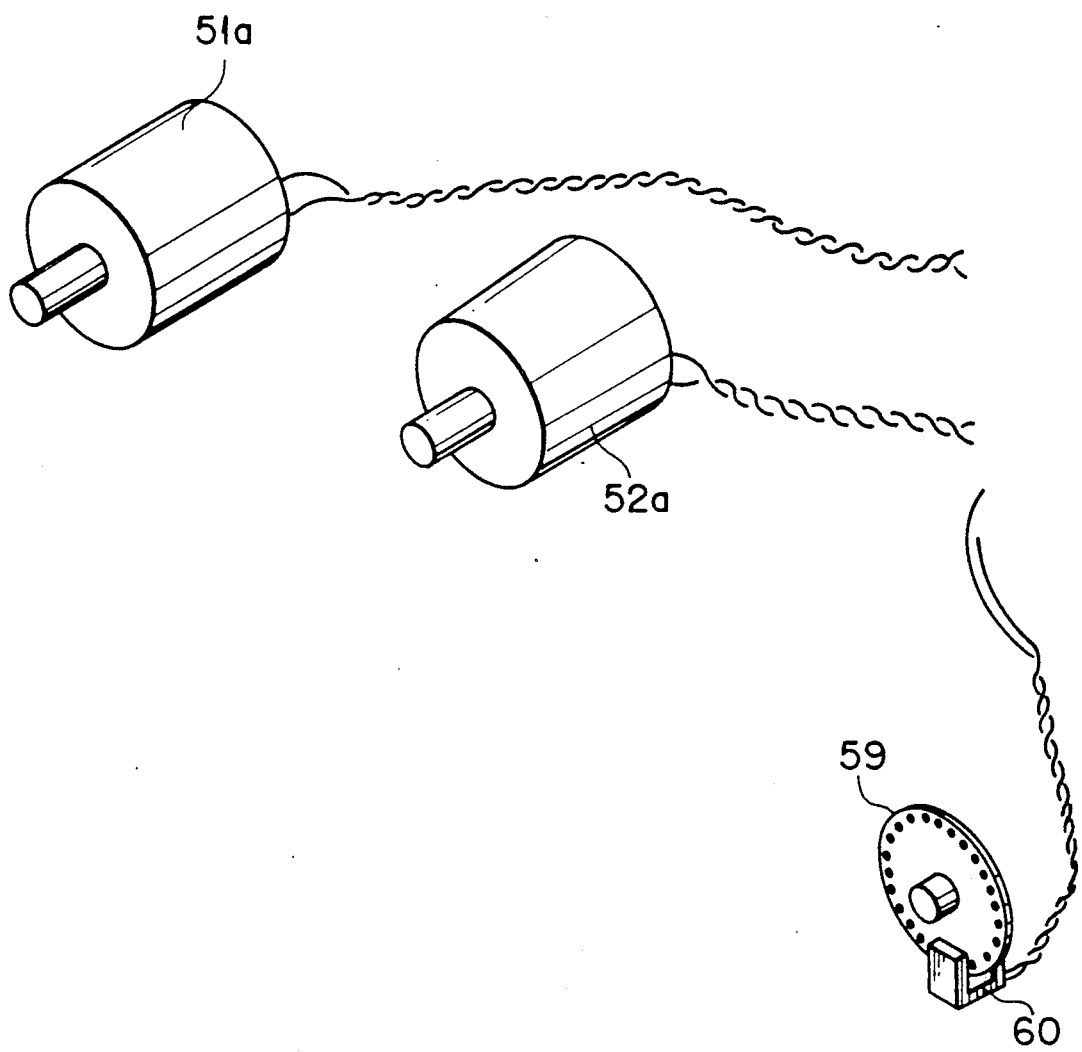
FIG. 3 shows motors, an encoder and a photointerrupter used in the sheet-feed control system.

The sheet-feed control system according to this invention basically includes a sheet feeding unit 51 for feeding the microcapsule sheet 13 along a sheet feed path, a sheet rewinding unit 52 for rewinding the microcapsule sheet 13 and a control unit comprising a microcomputer 56 connected through an interface circuit 54 to the motors 51 and 52. The sheet feeding unit 51 comprises, for example, a rotating motor 51a for rotating the takeup shaft 15, and the sheet rewinding unit 52 comprises, for example, a rotating motor 52b for rotating the shaft 14. The control unit 56 controls the driving of the sheet feeding unit 51 and the sheet rewinding unit 52, for example, controls the motors 51a and 52a to drive and cease the rotation of the motors 51 and 51, to thereby control the sheet feeding and rewinding operations. The control unit 56 is further connected through the interface circuit 54 to a mode change-over switch 58 for selecting one of at least two modes such as a saving mode (first mode) of the microcapsule sheet and a speedy mode (second mode) of the microcapsule sheet, and a sheet feed detector 53 for detecting a sheet feed speed. The sheet feed detector 53 comprises an encoder 59 provided to a shaft of the roller 16 and a photointerrupter 60 for detecting the rotation of the encoder 59 to detect a rotational number or a rotational speed of the encoder (that is, to detect a sheet feed speed). The motors 51a and 52a, the encoder 59 and the photointerrupter 60 are shown in FIG. 3. The saving mode means a mode in which a rewinding operation is carried out to effectively use the microcapsule sheet, while the speedy mode means a mode in which no rewinding operation is carried out to carry out an image forming process at high speed.

Figure 4:
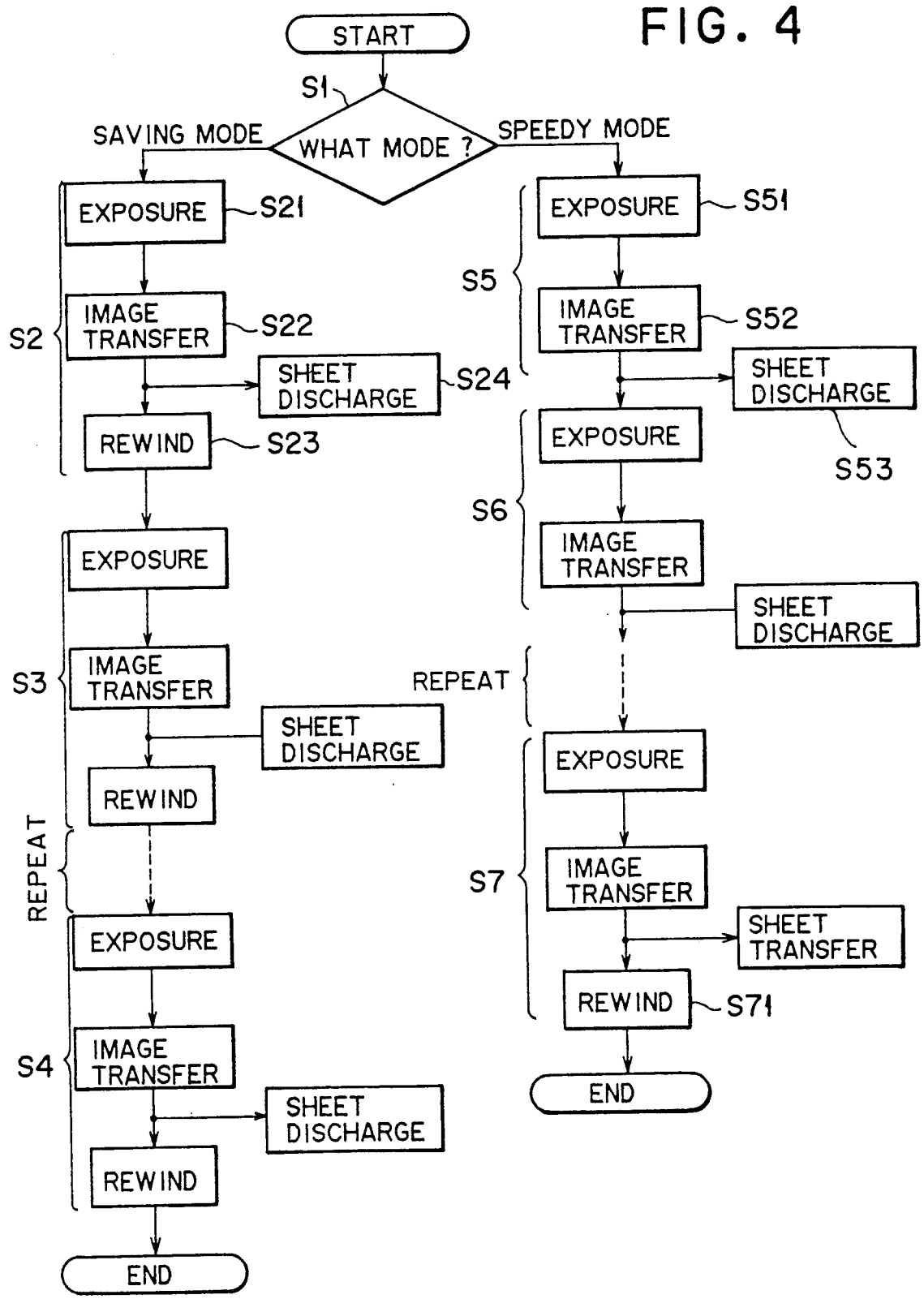
FIG. 4 is a flow chart showing an image forming process using speedy and saving modes.

A control operation of the sheet-feed control system thus constructed will be described with reference to a flow chart of FIG. 4. In the following embodiment, a continuous copying operation and the two modes of saving and speedy modes are representatively adopted to easily understand an effect of this invention, however, an intermittent copying operation, and three or more modes may be adopted.

First, a number of sheets to be copied is set and one of the first and second modes is selected in a step S1.

Assuming that the saving mode is selected, the following steps are successively carried out.

A first sheet is subjected to a first copying operation in a step S2. The step S2 comprises the following substeps S21 to S23. An image light from the original is focused on the microcapsule sheet 13 by opening a shutter (not shown). At this time, the control unit 56 rotates the motor 51 so that a pulse interval generated by the photointerrupter 60 is equal to a predetermined period to feed the microcapsule sheet 13 at a constant speed. In synchronism with the feed of the microcapsule sheet 13, the original support glass plate 2 is moved in the horizontal direction, so that a latent image corresponding to the whole original image is formed on the microcapsule sheet 13 in the step S21. During the sheet feeding operation of the microcapsule sheet 13, the leading end of the latent image (light-exposed area) reaches the pressure-developing unit 19 and superposed with the developer sheet 17 to be subjected to a pressure-developing process in the step S22. Even though an exposure process is completed and the shutter is closed, the microcapsule sheet 13 is fed at the constant speed (the sheet feeding operation is continued) until the pressure-developing process is completed. Accordingly, a light-unexposed area of the microcapsule sheet 13 is also fed over the pressure-developing unit 19.

After the pressure-developing process is finished, the motor 52 is energized by the control unit 56 to rewind the microcapsule sheet 13 by a distance substantially equal to an interval distance along a sheet feed path between the exposure stand 7 and the pressure-developing unit 19 (or the separation roller 22) in the step S23. In this rewinding operation, the light-unexposed area can be subjected to a subsequent exposure process to form a latent image thereon. Simultaneously with the rewinding operation, the developer sheet 17 having a visible image thereon is heat-fixed in the heat-fixing unit 23 and then discharged to the discharge tray 24 in the step S24.

After the rewinding operation is finished, a second sheet is subjected to a subsequent image forming process in a step S3. Likewise, the subsequent sheets are repetitively subjected to the copying process until the last sheet of the set number of sheets has been subjected to the last copying process. After the last sheet is subjected to all of the copying operations in a step S4, the copying process is completely finished.

On the other hand, assuming that the speed mode is selected in the step S1, the following steps are carried out.

A first sheet is subjected to a first copying operation in a step S5. The step S5 comprises an exposure step S52, a pressure-developing step S52 and a discharging step S53. That is, the speedy mode has no rewinding step as carried out in the saving mode. Accordingly, in the speedy mode, the subsequent exposure step of a subsequent copying operation (S6) is carried out simultaneously with the discharging step of the previous copying operation. The subsequent sheets are repetitively subjected to the above copying operation. When the last sheet is subjected to the copying operation in a step S7, the same rewinding operation as that of the step S23 in the saving mode is carried out in a step S71, and then all of the copying operations are finished.

According to the image forming apparatus of this invention, an image forming process is carried out at high speed and in low cost by effectively using the microcapsule sheet. Particularly, in a case of continuously copying two or more sheets, an effective use of the microcapsule sheet is performed and a running cost is reduced by selecting the saving mode, and an image forming speed is increased by selecting the speedy mode.

What is claimed is:

1. An image forming apparatus using an elongated photosensitive recording medium for performing a series of image forming processes while feeding the elongated photosensitive recording medium along a medium feeding path, comprising:

exposing means, located along said medium feeding path, for exposing the photosensitive recording medium to light in an exposure process to form a latent image thereon;

developing means, disposed downstream of said exposing means with respect to the medium feeding path, for developing the latent image into a visible image in a developing process;

medium feeding means for feeding the photosensitive recording medium through said exposing means over said developing means along the medium feeding path;

medium rewinding means for rewinding the photosensitive recording medium after the developing process to feed the photosensitive recording medium to a predetermined position in the medium feeding path, thereby performing a medium rewinding operation; and control means for controlling driving of said exposing means, said developing means, said medium feeding means and said medium rewinding means to perform the series of image forming processes; and selecting means having at least two image forming modes for allowing said control means to selectively cease only the medium rewinding operation of said medium rewinding means during the series of image forming processes when one of said image forming modes is selected.

2. The image forming apparatus as claimed in claim 1, wherein said medium feeding means comprises a rotatable takeup shaft for winding the photosensitive recording medium therearound and a first motor for rotating said takeup shaft, and said medium rewinding means comprises a rotatable shaft for accommodating the photosensitive recording medium in a roll state and a second motor for rotating said shaft in a reverse direction to a medium feed-out direction to thereby rewind the photosensitive recording medium.

3. The image forming apparatus as claimed in claim 2, wherein said control means comprises a microcomputer for controlling said first and second motors to drive only said first motor when said one mode is selected and to successively drive both of said first and second motors when the other mode is selected.

4. The image forming apparatus as claimed in claim 1, further comprising a detector for detecting a medium feeding speed of the recording medium.

5. An image forming apparatus as claimed in claim 1, wherein the image forming modes are freely switchable to each other by a user.

* * * * *